(12) United States Patent
Shimoyama et al.

(10) Patent No.: US 7,356,726 B2
(45) Date of Patent: Apr. 8, 2008

(54) FREQUENCY CONTROL APPARATUS FOR CONTROLLING THE OPERATION FREQUENCY OF AN OBJECT

(75) Inventors: Takeshi Shimoyama, Tokyo (JP); Tetsumasa Meguro, Tokyo (JP); Tsutomu Teranishi, Kanagawa (JP); Yasuo Nakano, Tokyo (JP); Hirokazu Kawahara, Kanagawa (JP)

(73) Assignee: Sony Corporation, Tokyo (JP)

( * ) Notice: Subject to any disclaimer, the term of this patent is extended or adjusted under 35 U.S.C. 154(b) by 151 days.

(21) Appl. No.: 10/552,897

(22) PCT Filed: May 7, 2004

(86) PCT No.: PCT/JP2004/006517

§ 371 (c)(1),
(2), (4) Date: Oct. 11, 2005

(87) PCT Pub. No.: WO2004/100370

PCT Pub. Date: Nov. 18, 2004

(65) Prior Publication Data

US 2006/0212247 A1 Sep. 21, 2006

(30) Foreign Application Priority Data

May 7, 2003 (JP) ............................. 2003-129219
Jul. 9, 2003 (JP) ............................. 2003-272333

(51) Int. Cl.
*G06F 1/04* (2006.01)

(52) U.S. Cl. ...................................... 713/600; 713/322
(58) Field of Classification Search ................. 713/322
See application file for complete search history.

(56) References Cited

U.S. PATENT DOCUMENTS 5,630,148 A * 5/1997 Norris ......................... 713/322
5,774,704 A * 6/1998 Williams ..................... 713/501

(Continued)

FOREIGN PATENT DOCUMENTS

EP 0712 064 5/1996

(Continued)

*Primary Examiner*—Chun Cao
(74) *Attorney, Agent, or Firm*—Oblon, Spivak, McClelland, Maier & Neustadt, P.C.

(57) ABSTRACT

A frequency control apparatus and an information processing apparatus includes an observation section for observing an operation state of a control object which operates with a variably controlled frequency, a frequency determination section for determining a clock frequency in response to the operation state, and a frequency limitation section for limiting a range or a value of the clock frequency determined by the frequency determination section. If the frequency determined in response to the operation state of the control object is within an allowable range, the control is performed with the frequency, but if the frequency is outside the allowable range, the frequency is limited to the range.

30 Claims, 11 Drawing Sheets

U.S. PATENT DOCUMENTS

| | | | |
|---|---|---|---|
| 5,799,198 A * | 8/1998 | Fung | 713/323 |
| 5,812,860 A * | 9/1998 | Horden et al. | 713/322 |
| 5,996,084 A * | 11/1999 | Watts | 713/323 |
| 6,073,244 A * | 6/2000 | Iwazaki | 713/322 |
| 6,081,901 A * | 6/2000 | Dewa et al. | 713/300 |
| 6,311,287 B1 * | 10/2001 | Dischler et al. | 713/601 |
| 6,487,668 B2 * | 11/2002 | Thomas et al. | 713/322 |
| 6,574,739 B1 * | 6/2003 | Kung et al. | 713/322 |
| 6,751,741 B1 * | 6/2004 | Kawahara et al. | 713/320 |
| 6,768,358 B2 * | 7/2004 | Birk et al. | 327/156 |
| 6,785,829 B1 * | 8/2004 | George et al. | 713/320 |
| 6,986,068 B2 * | 1/2006 | Togawa | 713/320 |
| 7,159,134 B2 * | 1/2007 | Soerensen et al. | 713/322 |
| 2001/0047494 A1 | 11/2001 | Douglass et al. | |

FOREIGN PATENT DOCUMENTS

| | | |
|---|---|---|
| JP | 8-76874 | 3/1996 |
| WO | WO 02/21245 A1 | 3/2002 |
| WO | 03-021407 | 3/2003 |

\* cited by examiner

F I G. 5
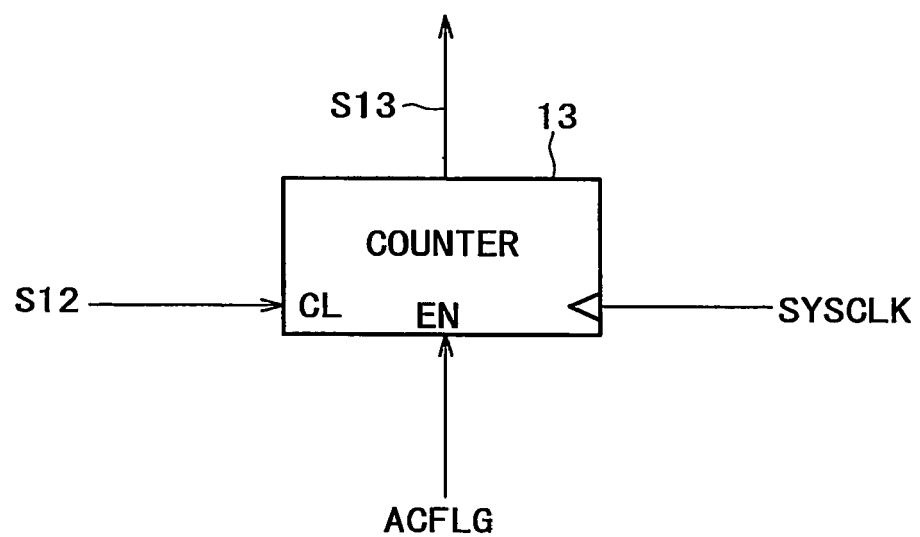

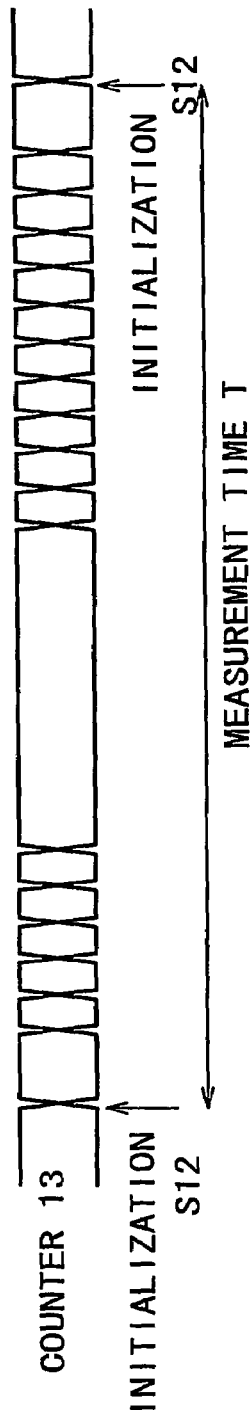
FIG. 6A  SYSCLK
FIG. 6B  ACFLG
FIG. 6C  COUNTER 13

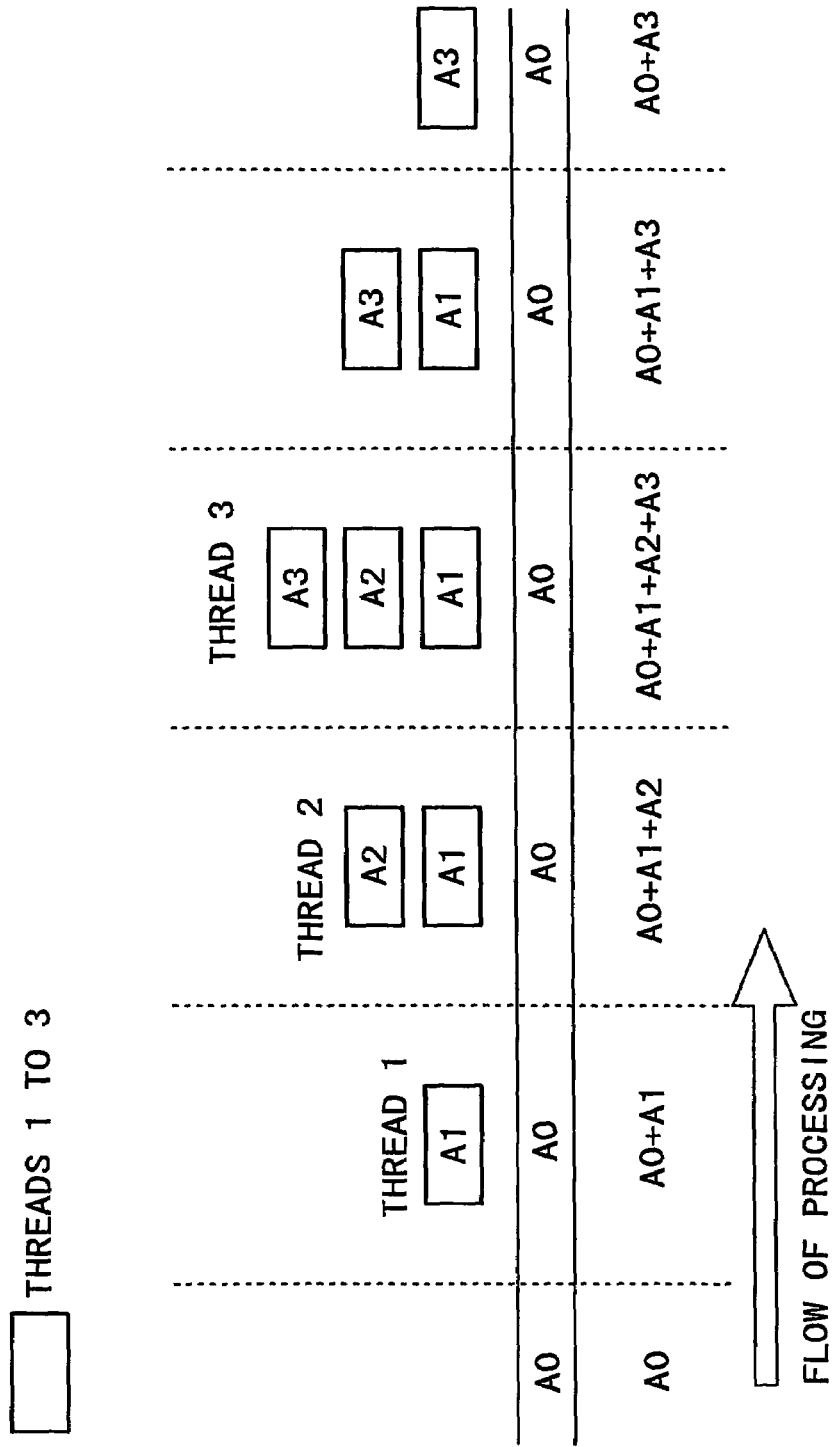
F I G. 11

FREQUENCY CONTROL APPARATUS FOR CONTROLLING THE OPERATION FREQUENCY OF AN OBJECT

TECHNICAL FIELD

This invention relates to a technique for observing an operation state of a control object to appropriately control the operation frequency of the control object

BACKGROUND ART

The power consumption of an electronic circuit system depends upon the power supply voltage and the clock frequency for operating the system, that is, increases in proportion to the square of the power supply voltage and to the frequency of the clock. However, the operation state or the load situation is not fixed with an information processing apparatus such as a computer. An architecture of a system is known wherein the system state changes such that, for example, when the system has a task to process, it operates, but when it has no other task to process after the process of the task comes to an end, the system enters a standby state.

Several methods are known wherein an operation state of a system is observed and a clock or the like is controlled to reduce wasteful power consumption. According to one of the methods, the clock frequency is decreased when it is detected that the system enters a standby state as disclosed, for example, in Japanese Patent Laid-Open No. Hei 11-219237 (hereinafter referred to as Patent Document 1). According to another one of the methods, the load situation of a bus is measured to calculate a bus access rate within a predetermined period of time, and the clock is changed over between different clocks in response to the access rate as disclosed, for example, in Japanese Patent Laid-Open No. Hei 11-184554 (hereinafter referred to as Patent Document 2).

The method of the Patent Document 1, however, has a problem in that, where a system frequently repeats a transition between a standby state and an operation state, it is necessary to perform a changeover process of the clock frequency every time. The method of the Patent Document 2 has another problem in that a circuit for supervising the load situation of a bus is required and also in that-it is not sufficiently high in flexibility in that the load situation of the bus and the load situation of the system do not always coincide with each other. Therefore, the assignee of the present patent application has proposed an architecture which provides a high flexibility and can reduce the load to the system as a countermeasure against the problems of the related art methods described above. According to the architecture, the clock frequency can be changed automatically in response to a ratio of the operation state of the system, and an optimum control is used in response to an activity (a ratio with which a target circuit is in an operation state within a predetermined period of time) to minimize the power consumption of the system.

The architecture described above, however, has a problem in the degree of freedom in design in regard to control for determining an operation frequency appropriate to an operation state of a system.

For example, where an architecture which includes an observation circuit or a like circuit for supervising an operation state of a target circuit, that is, an object of frequency control includes a hardware configuration for calculating an optimum clock frequency through fixed circuit calculation from a result of the observation of the clock frequency, it is difficult to control the frequency paying sufficient attention to the accuracy, a characteristic of a load itself and so forth. It is estimated that various tasks are processed by a system (computer equipment and so forth) including a task of a type which should be completed as early as possible at any rate such as, for example, an ordinary calculation process and search process and a task of another type which imposes only a fixed load and need not necessarily be completed early such as, for example, reproduction of music or moving pictures. Therefore, it is almost impossible to implement a configuration for determining an optimum frequency for all of the task types. Or, since a configuration or process which is much complicated in mounting of hardware is inevitably required, the architecture described above has a problem in terms of the cost and the design. In particular although it is necessary to determine an optimum operation frequency in response to a situation which varies every moment in order to make it possible to effect augmentation of the performance and power-saving to be exhibited through control of the operation frequency of the control object, it sometimes becomes necessary to change the point of view of frequency determination or the algorithm in response to various situations or it is sometimes obliged to make an extensive design change. For example, it is obliged to make a devise for control logic.

DISCLOSURE OF THE INVENTION

It is an object of the present invention to provide a frequency control apparatus and an information processing apparatus wherein it is possible, in control of an operation frequency of a control object performed in response to a result of observation of an operation state of the control object, to Emit the operation frequency or designate an allowable value or the like to achieve improvement in performance and power-saving.

In order to attain the object described above, according to an aspect of the present invention, there is provided a frequency control apparatus which observes an operation state of a control object and controls an operation frequency of the control object, including frequency determination means for determining the operation frequency in response to the operation state of the control object, and frequency limitation means for limiting a range or a value of the operation frequency determined by the frequency determination means.

According to another aspect of the present invention, there is provided an information processing apparatus for controlling a frequency of a clock signal to be supplied to an object device which operates with a frequency variably set at any time, including means for observing an operation state of the object device, frequency determination means for determining the frequency in response to the operation state of the object device, and frequency limitation means for limiting a range or a value of the frequency determined by the frequency determination means.

With the frequency control apparatus and the information processing apparatus, if the frequency determined in response to the operation state of the control object is within an allowable range or has an allowable value, the control is performed with the frequency. However, if the frequency is outside the allowable range or does not have the allowable value, the frequency is limited to the allowable range or allowable value Consequently, the control can be performed appropriately and prevent occurrence of an unintended situation.

Further, since a countermeasure is taken for limiting the operation frequency of the control object, it is assured to perform appropriate frequency control in accordance with a load characteristic or the like, and therefore, augmentation in performance and power-saving can be anticipated Besides, an extensive design change in ah or the like is no required.

Also it is possible to limit the operation frequency so that it may not come out of a prescribed or designated frequency range or invalidate an unexpected frequency value.

According to a further aspect of the present invention, there is provided a program which is used to function in an apparatus for observing an operation state of a control object to control an operation frequency of the control object, including a step of setting, upon or after activation of the program, a limitation value for limiting the operation frequency in accordance with a characteristic of a load or an accuracy in processing.

With the program, the frequency can be limited through execution thereof, and flexible frequency control can be implemented in accordance with a nature of a task to be processed or the like.

Further, since an optimum frequency value or frequency range can be designated, deterioration of a performance, increase of power consumption and so forth can be prevented. Further, it is possible to prevent setting of operation frequency limitation by the program from having a bad influence on a process after execution of the program comes to an end.

The above and other objects, features and advantages of the present invention will become apparent from the following description and the appended claims, taken in conjunction with the accompanying drawings in which like parts or elements denoted by like reference characters.

BRIEF DESCRIPTION OF THE DRAWINGS

FIG. 5 is a block diagram showing an example of a configuration of a counter shown in FIG. 3;

FIGS. 6A, B, C is a timing chart illustrating operation of the counter shown in FIG. 5;

FIG. 11 is a diagrammatic view illustrating a concept of an example of setting of a frequency in response to activation or ending of a thread

BEST MODE FOR CARRYING OUT THE INVENTION

Figure 1:
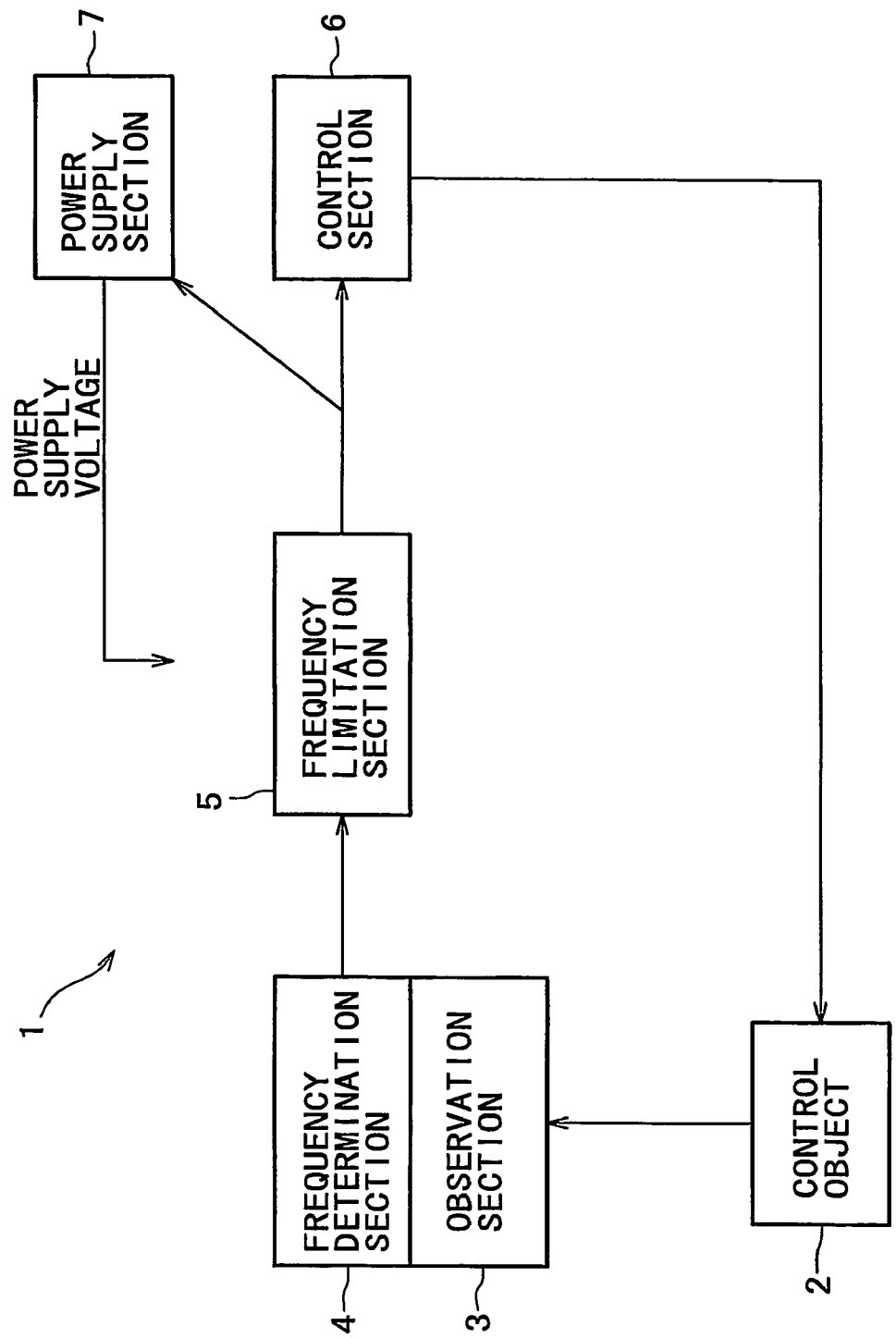
FIG. 1 is a block diagram showing a basic configuration of an information processing apparatus according to the present invention.

FIG. 1 conceptive illustrates an example of a basic configuration of a frequency control apparatus of an information processing apparatus according to the present invention. Referring to FIG. 1, it is presupposed that a frequency control apparatus 1 can control the operation frequency of a control object 2 of the information processing apparatus. For example, a central processing unit (CPU), a coprocessor and an image pickup device can be listed as a device for arithmetic operation processing which operates based on a frequency selectively set among a plurality of clock frequencies and may be used as the control object The frequency control apparatus 1 includes an observation section 3 for observing an operation condition of the control object 2 and controls the operation frequency of the control object 2.

A frequency determination section 4 is provided to determine the operation frequency of the control object 2 in response to an operation condition of the control object 2 observed by the observation section 3. In particular, the frequency determination section 4 calculates a frequency which is estimated or predicted as optimum to a current state of the control object 2 based on information obtained through observation of the control object 2. It is to be noted that a particular calculation method for the frequency is hereinafter described in detail.

An output of the frequency determination section 4 is signaled to a control section 6 through a frequency limitation section 5.

The frequency limitation section 5 is provided to limit the range or the value of the operation frequency determined by the frequency determination section 4. In particular; the frequency limitation section 5 reviews the operation frequency determined by the frequency determination section 4 to detect whether or not the operation frequency may be conveyed as it is to the control section 6. If it is detected that the operation frequency does not remain in the allowable range, the frequency limitation section 5 limits the frequency.

In particular, if it is supposed that the control object 2 is a CPU, the frequency of a clock signal which is supplied to the CPU and defines the operation frequency of the CPU, that is, the clock frequency determined by the frequency determination section 4 based on a result of observation, may not possibly remain within a frequency range or not have a frequency value prescribed or designated in advance. In this instance, the frequency limitation section 5 plays a role of limiting the frequency of the clock frequency to a value within the predetermined frequency range or to the predetermined frequency value. For example, if it is discriminated that the frequency exceeds the upper limit value of the allowable range, the frequency limitation section 5 limits the frequency to the upper limit value or lower. On the other hand, if it is discriminated that the frequency is lower than the lower limit value of the allowable range, the frequency limitation section 5 limits the frequency to the lower limit value or more. To this end, the frequency limitation section 5 includes a threshold value setting section for setting one or both of threshold values for the upper and lower limits to the frequency of the clock signal.

The control section 6 controls the operation frequency of the control object 2 in response to an output of the frequency limitation section 5. For example, a clock signal supply circuit which produces a clock signal (system clock) based on frequency information from the frequency limitation section 5 or a like circuit and supplies the clock signal to the control object or a like circuit is used for the control section 6.

A power supply section 7 supplies a power supply voltage suitable for an operation frequency of the control object 2 in response to an output of the frequency limitation section 5 to various components of the frequency control apparatus 1 or of the system including the frequency control apparatus 1. The power supply section 7 is required in order to supply a power supply voltage conforming with the clock signal.

While the frequency determination section 4 forms hardware of the system, if a process for determination of the operation frequency for the control object 2 is assigned fully to the hardware and an instruction of determined frequency information is sent as it is to the control section 6, flexibility in the frequency control cannot be anticipated Preferably, therefore, a section for lining the upper limit or the lower limit to the frequency is provided for the frequency information determined by the hardware to compulsorily change the frequency so that the frequency may not come out of the allowable range. Thus, the frequency control apparatus 1 is configured so that the upper limit value or/and the lower limit value can be changed dynamically by software and it can be designated by software whether the limitation section should be rendered valid or invalid. To this end, a frequency setting register with which a threshold value can be changed dynamically through execution of a program may be used as the upper or lower limit threshold value setting section. Each of such threshold values is a registered value as viewed from an interpretation and execution section (CPU) for a program, and the section described above is implemented by varying the register value.

The following threshold value setting forms are available:

A form wherein the threshold values for the upper and lower limits are set simultaneously to limit the frequency width of the clock signal; and Another form wherein the threshold values for the upper and lower limits are set to an equal value so that the frequency of the clock signal is set to the fixed value.

Where the frequency is limited to a fixed value as in the latter form, automatic change of the frequency by the hardware can be invalidated temporarily.

On the other hand, where the frequency control apparatus 1 is configured such that it includes a frequency designation section such as a frequency determination register for designating the frequency of the clock signal, it is possible to directly set the value of the clock frequency and designate the frequency by means of software or external hardware while invalidating a clock frequency calculated by the frequency determination section 4 which determines a clock frequency.

For example, such controls as described below can be anticipated by the mechanism described above:

To control the frequency such that, even if the frequency determination section 4 determines that the current frequency should be raised or lowered based on information from the observation section 3, the determination is invalidated and the frequency is not raised or lowered from a fixed value which can be set by software or the like; and To control the frequency with a fixed frequency or a variable frequency determined by software or the like while a frequency determined by the frequency determination section 4 based on information from the observation section 3 is temporarily invalidated.

Now, a program used to function by an apparatus for observing the operation condition of the control object 2 and controlling the operation frequency of the control object 2 is described The program can be applied, for example, to a program for implementing a function in a utility or an application or in basic software such as an OS (Operating System) or a like program.

Figure 2:
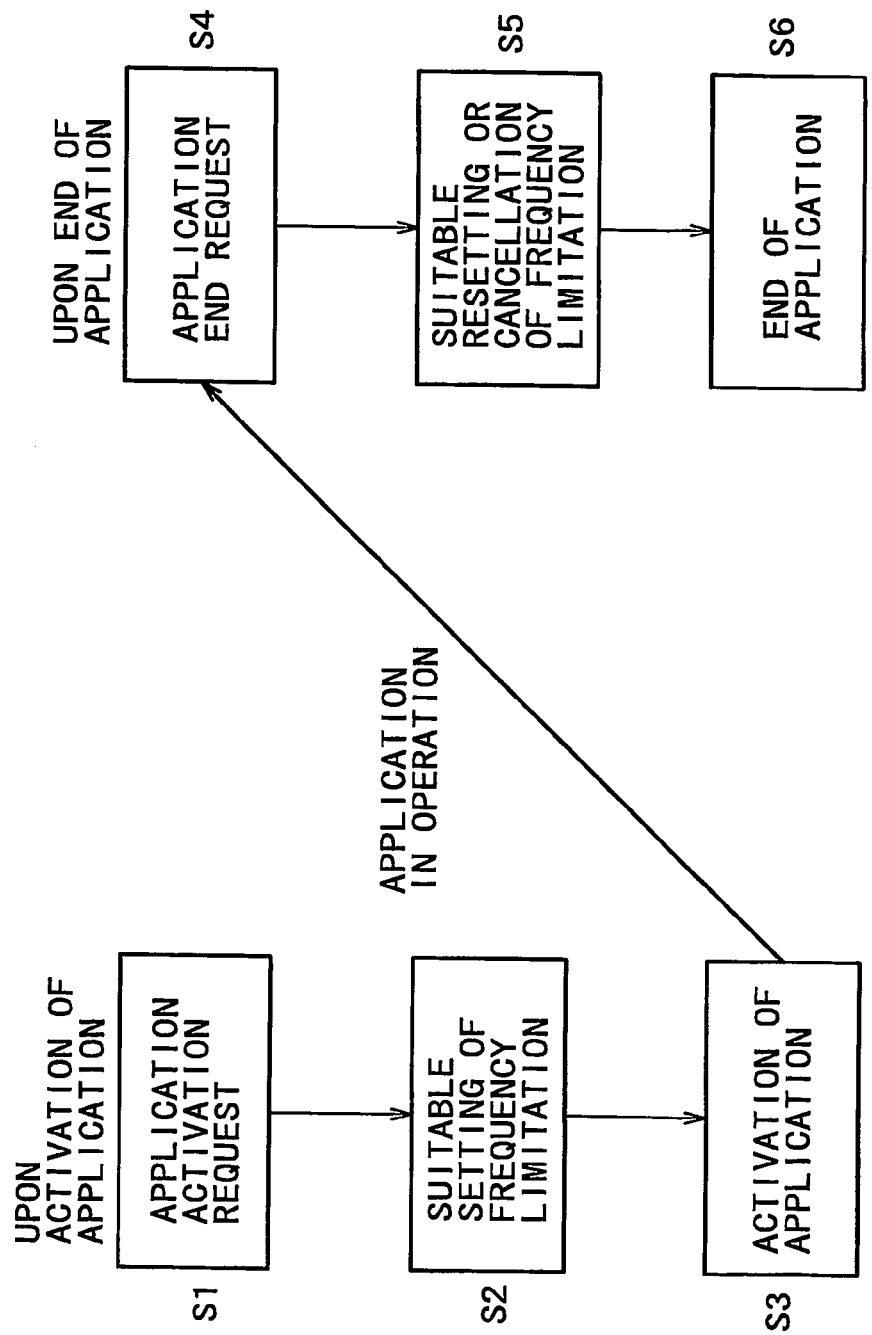
FIG. 2 is a flow chart illustrating an example of a process for frequency limitation by the information processing apparatus of FIG. 1.

FIG. 2 illustrates an outline of an example of a process where it is discriminated whether or not the control described above should be performed upon activation or ending of an application or program to set an appropriate frequency value. By activating the application, an operation, performance, power consumption and so forth of the system during the operation of the application can be optimized First, when an application is to be activated, a request for activating the application is issued at step S1, and then a frequency limitation setting process is executed at step S2. In particular, at step S2, a limitation value or values for limiting the clock frequency (operation frequency) is set in accordance with a characteristic of a load, an accuracy in processing and so forth For example, when music reproduction, moving picture reproduction or the like is to be performed, the clock frequency is temporarily limited by software processing so that it may not be raised or lowered by an unnecessary amount by the frequency determination circuit to achieve improvement in performance or reduction of the power consumption.

Then at step S3, the application is activated, and thereafter operation of the application is continued and predetermined program processes are executed.

Then, when the application is to be ended, a request for ending the application is issued at step S4, and a frequency limitation resetting or cancellation process is executed at step S5. In other words, the frequency limitation having been performed upon activation of the application is canceled or resetting of the same is performed so that an appropriate frequency can be obtained in accordance with the operation condition Then, the application is ended at step S6.

It is to be noted that, while the processes at steps S2 and S5 illustrated in FIG. 2 are executed by an OS, a device driver, a library (a set of subroutines) or the like, they may otherwise be executed by the application itself. In this instance, the processes at steps S2 and S3 are executed in the reverse order, and setting of frequency limitation is performed at a suitable point of time after the application is activated. The process at step S5, however, need not be executed restrictively at the ending of the application but may be executed during operation of the application as occasion demands taking processing contents, the magnitude of the load and so forth into consideration.

Such controls as described above are performed, for example, in the following cases:

In a case wherein, only when a circuit as hardware which requires a fixed frequency is to operate, the frequency is set to the lowest frequency, but when the circuit is not to operate, the limitation is cancelled so that a lower frequency can be set;

In another case wherein the operation of hardware which does not operate with a lower or higher frequency region is limited to an appropriate range;

In a further case wherein, when software which includes a request for the lowest operation frequency or a request for the highest operation frequency such as that for decoding or encoding of an audio signal or a video signal is to operate, frequency limitation is performed to prevent an inadvertent alteration of the frequency or the frequency is prevented from being raised or lowered inadvertently upon operation of the application; and In a still further case wherein, when an application for which a performance, a processing speed or the like is required is to operate, a desired frequency is designated or the lowest frequency (lower limit) is set to a higher value in order to raise the performance even if an increase of power consumption is acknowledged such as, for example, upon writing or reading out of data into or from a semiconductor memory medium which can be removably loaded into the apparatus.

Now, an information processing apparatus to which the present invention is applied is described. It is to be noted that the information processing apparatus of the present embodiment can be applied to various apparatus including, for example, computer equipment, a PDA (Personal Digital Assistance), a mobile communication terminal apparatus, a video apparatus and an image pickup apparatus.

Figure 3:
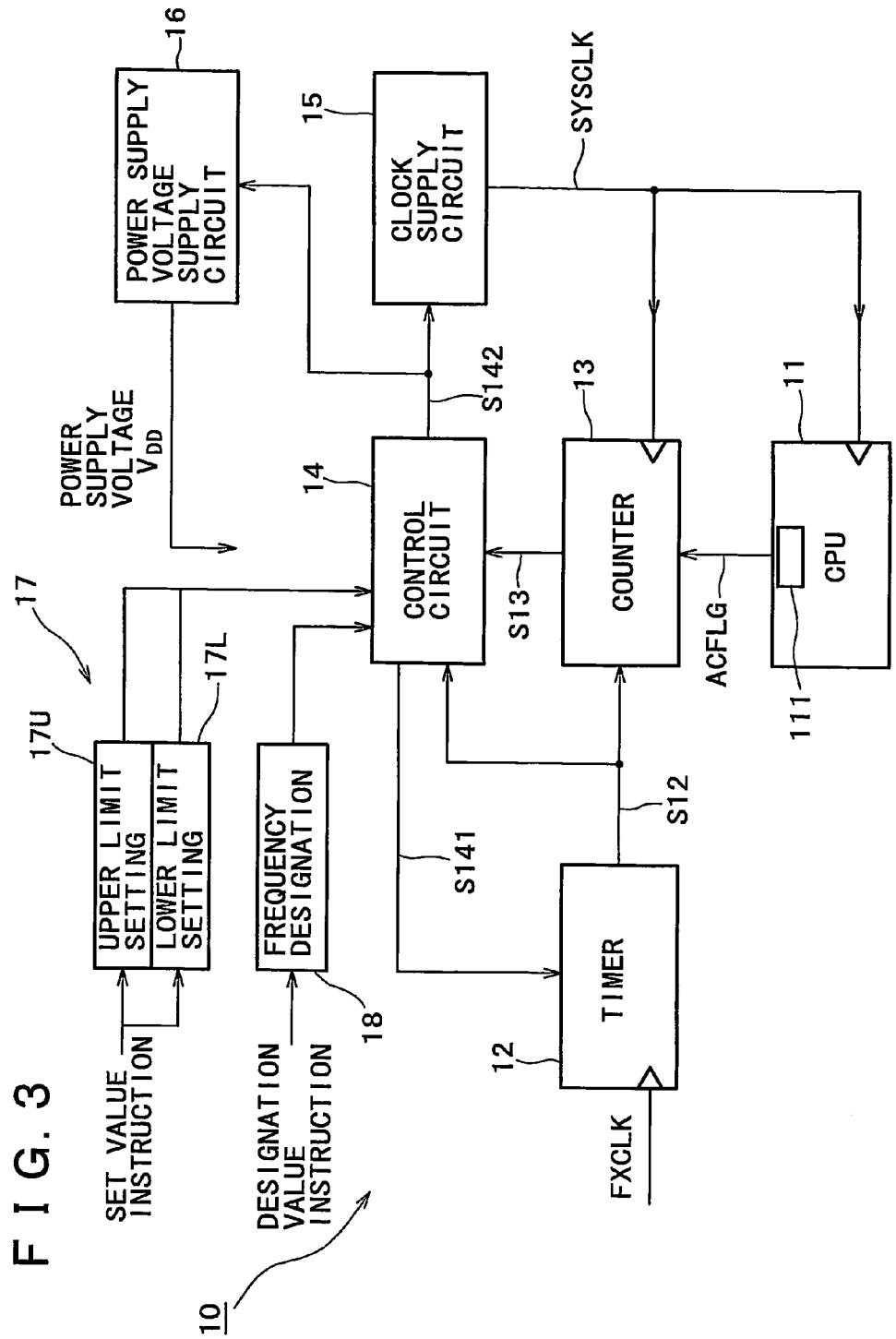
FIG. 3 is a block diagram showing a configuration of an information processing apparatus to which the present invention is applied.

FIG. 3 is a block diagram showing an example of a configuration of the information processing apparatus 10.

A CPU 11 is used as a target apparatus of an object of control of the information processing apparatus 10, and the information processing apparatus 10 includes a timer 12 and a counter 13 which form the observation section 3 described hereinabove, and a control circuit 14 which forms the frequency determination section 4. The information processing apparatus 10 further includes a clock supply circuit 15 which serves as the control section 6, and a power supply voltage supply circuit 16 which serves as the power supply section 7. It is to be noted that, in the information processing apparatus 10, the timer 12, counter 13, control circuit 14 and clock supply circuit 15 cooperatively form a frequency control circuit The CPU 11 operates in synchronism with a system clock SYSCLK supplied thereto from the clock supply circuit 15. The clock supply circuit 15 can operate with a frequency set at any time among a plurality of clock frequencies to produce a clock frequency of multiple gradations or stages as hereinafter described. Thus, the CPU 11 repeats a standby state and an operating state to process a desired task.

The CPU 11 has an activity flag register 111 to which a flag of 1 bit representing that the CPU 11 is active when the CPU 11 is in an operating state. The flag is hereinafter referred to as activity flag and denoted by ACFLG. For example, when the CPU 11 is in an operating state, a logical value "1" is set to the activity flag register 111, but when the CPU 11 is in a standby state, another logical value "0" representing that the CPU 11 is inactive is set to the activity flag register 111.

The CPU 11 sends the activity flag ACFLG set in the activity flag register 111 to the counter 13 to notify the counter 13 of an operation condition thereof.

A measurement time period T for measuring the activity of the CPU 11, that is, the ratio of the operating state within a predetermined period of time, is measured by the timer 12.

The timer 12 operates in synchronism with a clock signal FXCLK having a fixed frequency to measure a fixed period of time and outputs a result of the measurement every time as a signal S12 to the counter 13 and the control circuit 14.

Figure 4:
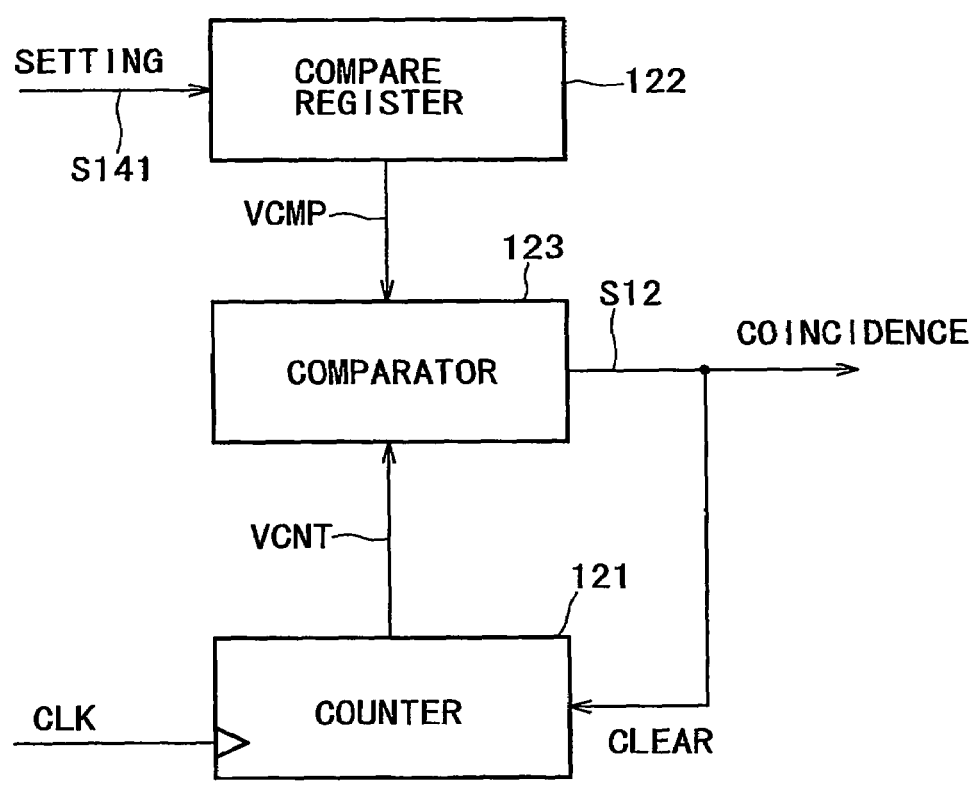
FIG. 4 is a block diagram showing an example of a configuration of a timer shown in FIG. 3.

FIG. 4 shows an example of a configuration of the timer 12. Referring to FIG. 4, the timer 12 includes a counter 121, a compare register 122 and a comparator 123.

The counter 121 measures the number of clock signals CLK and sends a count value VCNT thereof to the comparator 123. Further, a comparison value VCMP retained by the compare register 122 is sent to the comparator 123, by which it is compared with the comparison value VCMP.

The comparison value VCMP is set to the timer 12 in accordance with a signal S141 from the control circuit 14.

Then, at a point of time when the count value VCNT becomes coincident with the comparison value VCMP, a coincidence signal S12 representing the coincidence is outputted from the comparator 123 to the counter 13 and the control circuit 14. The coincidence signal S12 is sent also to a reset terminal of the counter 121 to clear the count value of the counter 121. Thus, the coincidence signal S12 is outputted in a fixed period in accordance with the measurement time period T which corresponds to the comparison value VCMP.

The counter 13 shown in FIG. 3 is a circuit for measuring the activity of the CPU 11 and operates in synchronism with the system clock SYSCLK Thus, the counter 13 counts pulses of the system clock SYSCLK when the CPU 11 is operative in accordance with the activity flag ACFLG of the CPU 11 and outputs the count value as a signal S13 to the control circuit 14.

FIG. 5 shows an example of a configuration of the counter 13.

When the activity flag ACFLG is inputted as an enable (EN) signal to the counter 13 and has the logical value "1", the counter 13 performs a counting up (addition) operation in synchronism with the system clock SYSCLK Further, every time the coincidence signal S12 is received as a clear signal from the timer 12, the counter 13 initializes the count value thereof.

FIGS. 6A to 6C are timing charts illustrating the operation of the counter 13 and show the waveforms of the system clock SYSCLK, activity flag ACFLG and the state of the counter 13, respectively.

The counter 13 initializes the count value thereof in response to the coincidence signal S12 sent thereto from the timer 12 after every measurement time period T as shown in FIG. 6C.

When the value of the activity flag ACFLG from the CPU 11 indicates an operating state of the CPU 11 as shown in FIG. 6B, that is, when the activity flag ACFLG in FIG. 6B exhibits the logical value "1", a counting operation, that is, an adding operation, of the counter 13 is performed On the other hand, when the value of the activity flag ACFLG from the CPU 11 exhibits a standby state of the CPU 11, that is, when the activity flag ACFLG exhibits the logical value "0", the counting operation is stopped.

Referring back to FIG. 3, the control circuit 14 is provided to determine the frequency of the system clock SYSCLK based on an operation state of the CPU 11 observed after every fixed interval of time. In particular, the control circuit 14 fetches the signal S13 from the counter 13 in synchronism with the coincidence signal S12 from the timer 12 to measure the activity ACT of the CPU 11 within the measurement time period T. Then, the control circuit 14 determines the frequency of the system clock SYSCLK to be set subsequently based on the measured activity ACT.

A threshold value setting section 17 for setting threshold values for an upper limit and a lower limit to the clock frequency determined in response to an operation state of the CPU 11 and forms the frequency limitation section 5. In the circuit shown in FIG. 3, the threshold value setting section 17 includes frequency setting registers 17U and 17L in which threshold values which can be changed dynamically through execution of a program are stored. In particular, the register 17U is used to set an upper limit frequency while the register 17L is used to set a lower limit frequency, and the register values set into them through an output port as a result of execution of a command by the CPU 11 are referred to by the control circuit 14. As a result of the provision of the registers for designating an upper limit and/or a lower limit to the frequency, the frequency calculated by the frequency control circuit is limited to the upper limit or the lower limit, that is, limited to a value within the range defined by the upper limit and/or the lower limit Or, since such control as to set the upper Emit and the lower limit to an equal value to temporarily fix the frequency so that a particular frequency may be obtained, can be performed by software processing, flexible frequency control suitable for a situation can be anticipated.

The control circuit 14 outputs a signal S142 for causing the system clock SYSCLK having a frequency determined in this manner to be supplied to the CPU 11 and the counter 13 to the clock supply circuit 15. Further, the control circuit 14 outputs a signal S141 of a comparison value VCMP to be set to the compare register 122 of the timer 12 to the timer 12.

It is to be noted that, in an architecture wherein a frequency designating register is provided as a frequency designation section 18 for directly designating the clock frequency by software, a frequency corresponding to a register value set as a result of execution of a command by the CPU 11 is defined by the control circuit 14, and in this instance, the fluency determined based on a result of measurement of the activity ACT is invalidated It is to be noted that, for the convenience of illustration, FIG. 3 shows both of the architecture which uses the registers 17U and 17L and the architecture which uses the register 18. However, when it is intended to raise the frequency, if the frequency cannot be changed suddenly to a designated frequency value, such a consideration as to gradually vary the designated frequency value so that the frequency may gradually approach the target frequency value. This similarly applies also to the architecture which uses the registers 17U and 17L to designate a particular frequency, and such a process as to gradually decrease the frequency width toward zero may be performed.

In order to cancel settings relating to the frequency limitation or the frequency designation as described above using software, for example, such a method as to set a special value as the register value or set a value which does not signify any numerical limitation such as, for example, a value exceeding the highest allowable frequency or zero may be used.

The clock supply circuit 15 produces and signals clock signals having different frequencies to the CPU 11 and so forth. In particular, the clock supply circuit 15 can produce a signal of a multiple gradation (stage) clock frequency as the system clock SYSCLK and supplies the system clock SYSCLK having a clock frequency indicated by the control signal S142 from the control circuit 14 to the CPU 11 and the counter 13. In order to obtain a multiple gradation clock frequency, various architectures can be applied including an architecture wherein a suitable clock signal is selected among a plurality of choices for the frequency, another architecture which allows the setting of the frequency value of a clock oscillation circuit to be changed arbitrarily and a further architecture wherein a plurality of frequencies are combined with respect to time such that clock signals having the frequencies are changed over after a predetermined interval of time, that is, an average frequency value within a predetermined period of time is controlled.

Figure 7:
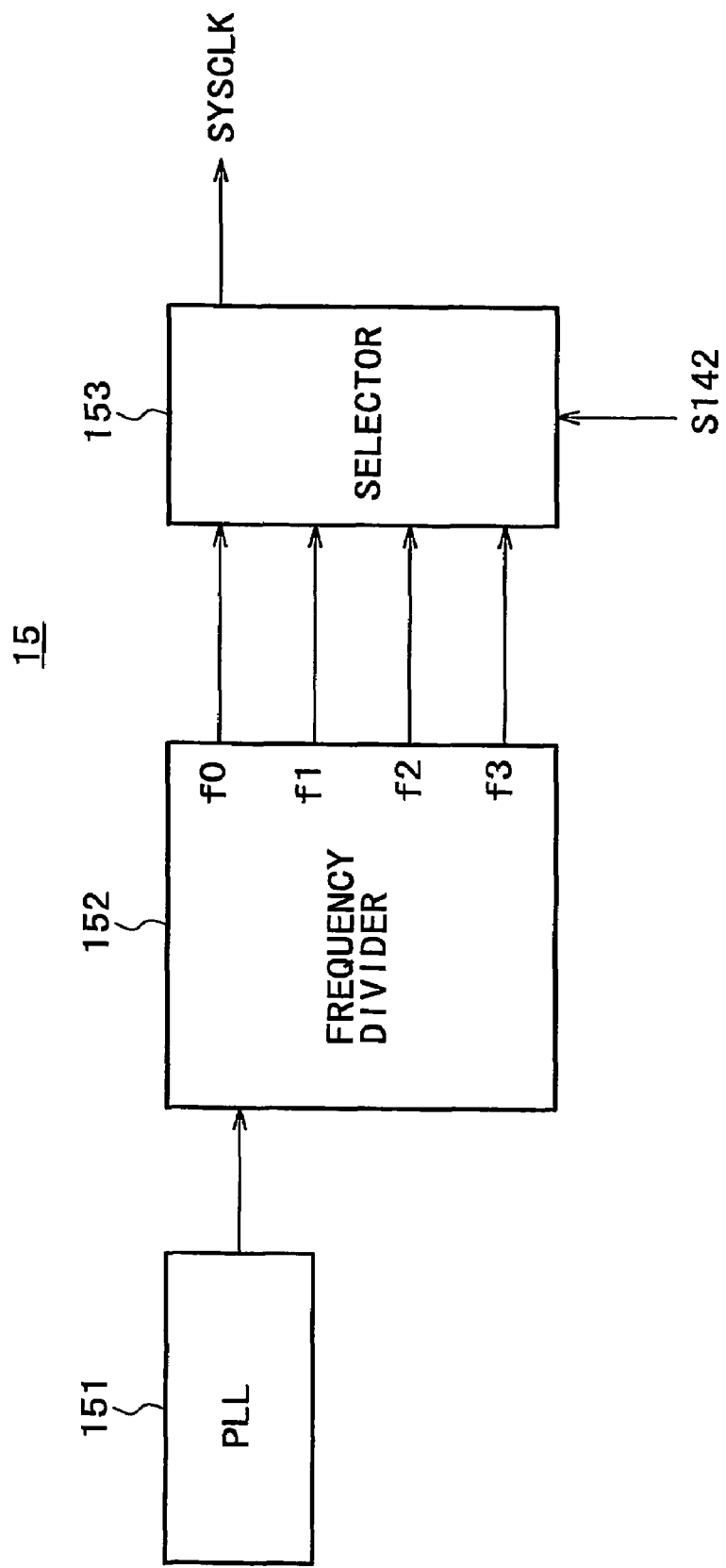
FIG. 7 is a block diagram showing an example of a configuration of a clock supply circuit shown in FIG. 3.

FIG. 7 shows an example of a configuration of the clock supply circuit 15.

Referring to FIG. 7, the clock supply circuit 15 shown includes a phase-locked loop circuit PLL circuit 151 for oscillating a clock signal of a predetermined frequency, a frequency divider 152, and a selector 153.

A clock signal sent from the PLL circuit 151 to the frequency divider 152 is divided in accordance with different dividing ratios to produce a plurality of, four in the clock supply circuit 15 shown in FIG. 7, clock signals having different clock frequencies f0, f1, f2 and f3.

The selector 153 selects one of the four clock signals from the frequency divider 152 which has a clock frequency indicated by the control signal S142 from the control circuit 14 and outputs the selected clock signal as the system clock SYSCLK.

It is assumed here that a clock signal of a frequency of 300 MHz is supplied from the PLL circuit 151 to the frequency divider 152 and the frequency divider 152 has dividing ratios of 1/3, 1/4, 1/6 and 1/12 set therefor. In this instance, the selector 153 selects one of clock frequencies of f0 (=100 MHz), f1 (=75 MHz), f2 (=50 MHz) and f3 (=25 MHz) obtained by the frequency division of the clock signal by the frequency divider 152 and outputs the clock signal of the selected clock frequency as the system clock SYSCLK It is to be noted that, according to control which uses a combination of frequencies; selection of the frequency f1 for t1 seconds and selection of the frequency for t2 seconds can be performed repetitively to set such an intermediate frequency as $(f1 \cdot t1 + f2 \cdot t2)/(t1+t2)$".

The control signal S142 of the control circuit 14 is sent not only to the clock supply circuit 15 but also to the power supply voltage supply circuit 16 (refer to FIG. 3). In other words, the lowest power supply voltage (hereinafter referred to as power supply voltage VDD) necessary to assure operation of the system with a frequency indicated by the clock supply circuit 15 is supplied to the components of the system. Thus, the power supply voltage VDD is varied or maintained in accordance with the indication of the control signal S142.

Figure 8:
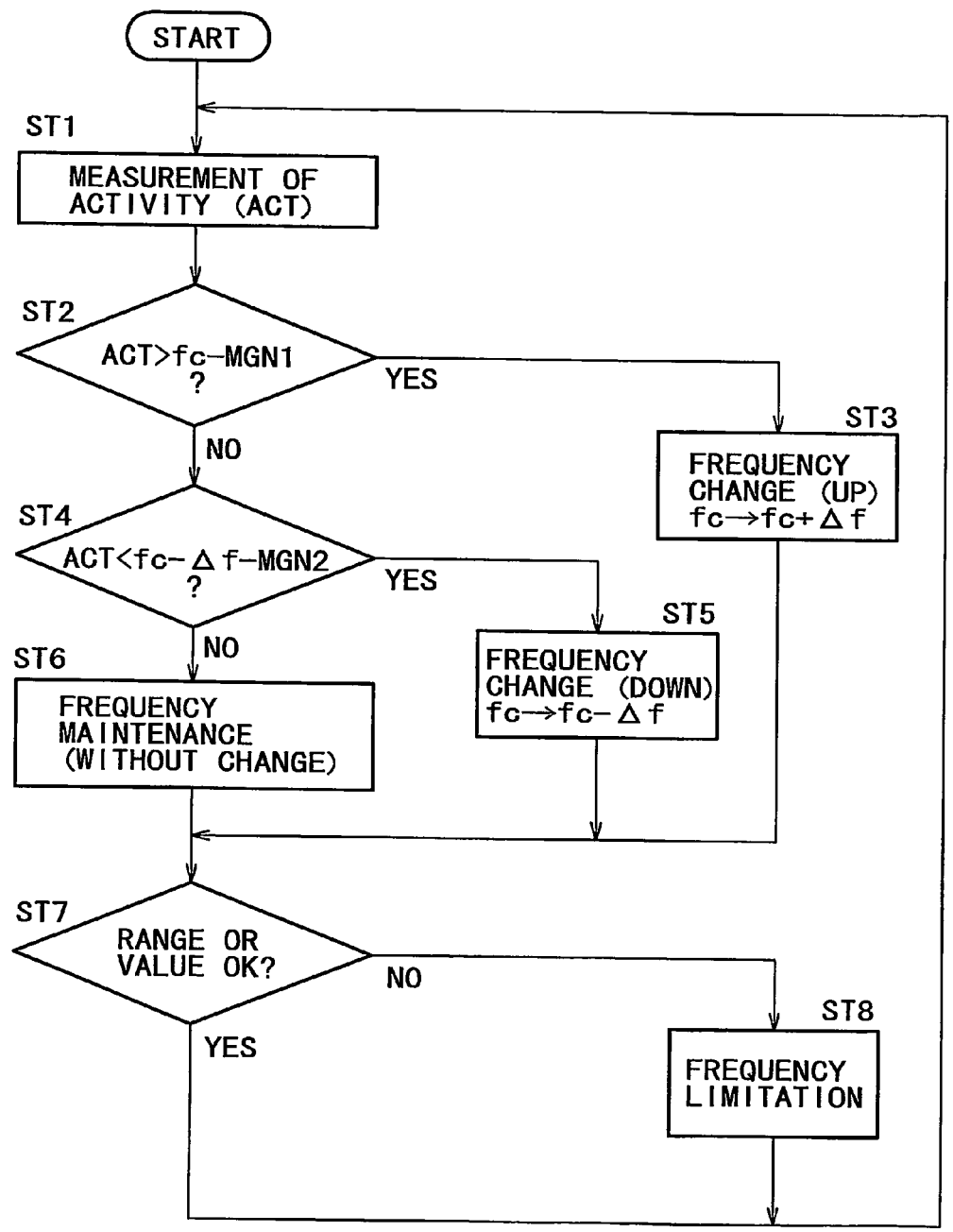
FIG. 8 is a flow chart illustrating operation of a control circuit shown in FIG. 3.

Now, operation of the control circuit 14 when some margin is taken into consideration in determination of the frequency of the system and a step between multiple gradation frequencies is taken into consideration in production of clock signals by the clock supply circuit 15 is described first with reference to a flow chart of FIG. 8.

The CPU 11 operates in synchronism with the system clock SYSCLK supplied thereto from the clock supply circuit 15 which can produce multiple gradation clock frequencies to process a desired task while repeating a standby state and an operating state. First at step ST1, the CPU 11 measures the activity ACT.

An outline of a processing procedure is such as described below.

(1) When the CPU 11 is in an operating state, the activity flag ACFLG is set to the register 111 (logic value "1"), but when the CPU 11 is in a standby state, the activity flag ACFLG is cleared in the register 111 (logic value "0").

(2) The value of the register 111 is signaled to the counter 13 so that the counter 13 is notified of the operation state of the CPU 11.

(3) The counter 13 receives the signal S12 representative of the measurement time period T from the timer 12 and performs a counting operation in accordance with a value indicated by the activity flag ACFLG. In other words, while the CPU 11 remains in an operating state, the counter 13 counts the system clock SYSCLK.

(4) The counter 13 outputs the count value thereof to the control circuit 14, and the control circuit 14 calculates the ratio of the period of time within which the CPU 11 has been operating within the predetermined measurement time period T, that is, the activity ACT of the system.

At next step ST2, the CPU 11 compares the acquired activity ACT with a first threshold value which is a difference of a current frequency fc from a margin MGN1. If the CPU 11 discriminates that the activity ACT is higher than the threshold value, it advances its processing to step ST3, but in the other case, its advances its processing to step ST4. It is to be noted that it is necessary to perform the comparison between the activity ACT and the current frequency fc in equivalent situations. In particular, taking it into consideration that the activity ACT is a function of the current frequency fc, it is necessary to convert the activity ACT into a frequency. In this instance, the activity ACT=100% is equivalent to the number of all clocks of the current frequency fc counted within the measurement time period T. Or, where the activity ACT represents a count value of clocks within the measurement time period T, naturally it is necessary to covert the current frequency fc into a clock count value within the measurement time period T.

At step ST3, since it is necessary to raise the frequency of the system clock SYSCLK, the CPU 11 adds a predetermined frequency step $\Delta f$ to the current frequency fc and adopts a resulting frequency value. In other words, the CPU 11 determines the frequency (current frequency fc+$\Delta f$) incremented by one step from the current frequency fc as a next frequency. Thereafter, the processing advances to step ST7.

On the other hand, at step ST4, the CPU 11 compares the activity ACT obtained at step ST1 described hereinabove with a second threshold value which is a difference of a margin MGN2 from a frequency obtained by subtracting the frequency step $\Delta f$ from the current frequency fc to decrement the current frequency fc by one step. If the CPU 11 discriminates that the activity ACT is lower than the threshold value, the processing advances to step ST5. In the other case, however, the processing advances to step ST6.

At step ST5, since it is necessary to lower the frequency of the system clock SYSCLK, the CPU 11 subtracts the predetermined frequency step $\Delta f$ from the current frequency fc and adopts a resulting frequency value. In other words, the CPU 11 lowers the current frequency fc by one step to obtain a frequency (fc−$\Delta f$) and determines the frequency (fc−$\Delta f$) as a next frequency. Thereafter, the processing advances to step ST7.

When none of the conditions at steps ST2 and ST4 is satisfied, the processing advances to step ST6, and this signifies that the activity ACT is in a state appropriate with respect to the frequency of the system clock SYSCLK. Therefore, the current frequency fc is maintained at step ST6. In this state, the processing advances to step ST7.

At step ST7 reached after step ST3, ST5 or ST6, the CPU 11 compares the changed or maintained frequency value with the frequency range or the frequency value prescribed by the registers (refer to reference numerals 17 and 18 of FIG. 3) to determine whether or not the frequency value is allowable. If the frequency value is allowable, the processing returns to step ST1, but if the frequency value is not allowable, the processing advances to step ST8.

At step ST8, the CPU 11 limits the frequency value to an upper or lower limit value or to a particular frequency value. Thereafter, the processing returns to step ST1.

In response to the frequency value determined in this manner, the clock supply circuit 15 selects a clock signal in accordance with the control signal S142 from the control circuit 14. In particular, one of the clock signals from the frequency divider 152 which has the clock frequency indicated by the frequency value is selected by the selector 153, and the selected clock signal is supplied as the system clock SYSCLK to the CPU 11 and the counter 13.

In this manner, variation or maintenance of the frequency is repeated in a period of the predetermined measurement time period T.

It is to be noted that, in order to determine a next frequency of the system clock based on a current frequency, conditions for raising the frequency and how to give an upper limit and a next frequency or conditions for lowering the frequency and how to give a lower limit and a next frequency should be defined appropriately in accordance with a configuration, characteristics and so forth of the system. Further, the margins MGN1 and MGN2 can be set suitably using a method which sets them to an equal value and another method which sets them to different values from each other such as, for example, a method which varies one or both of the margins stepwise or continuously in response to the activity ACT, frequency range or the like.

Figure 9:
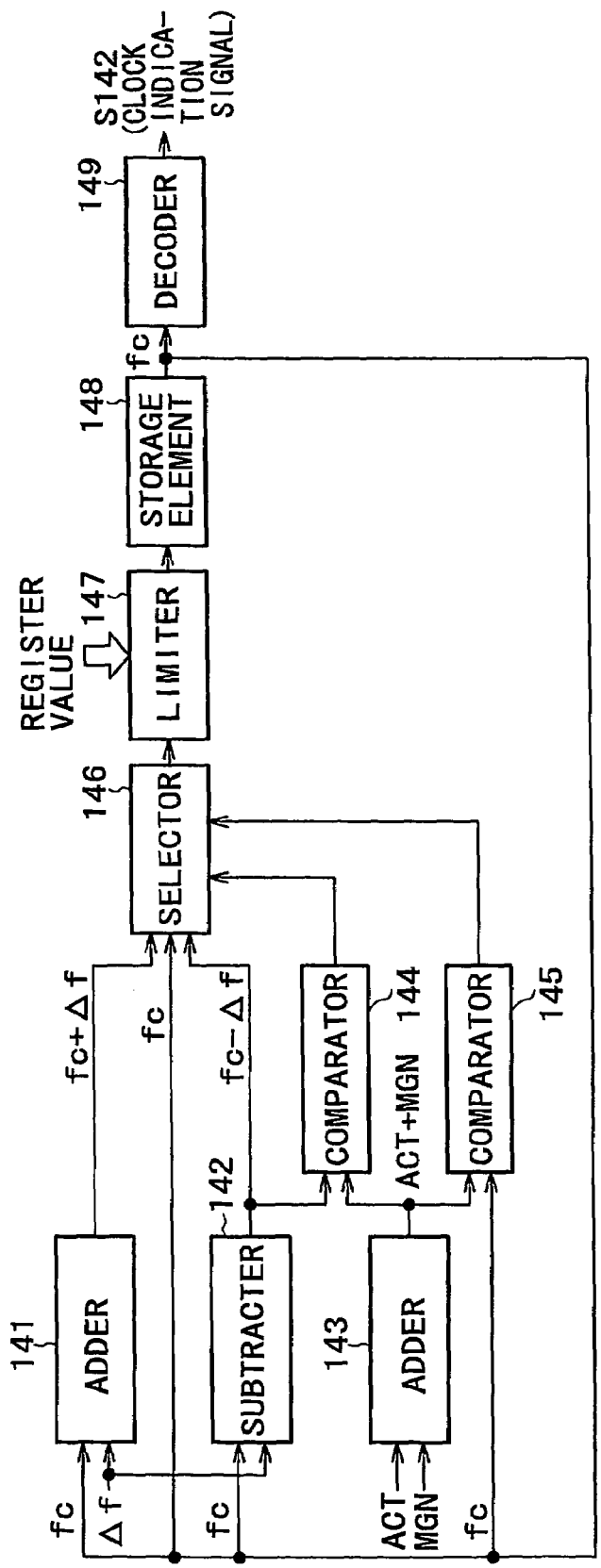
FIG. 9 is a block diagram showing an example of a configuration of the control circuit shown in FIG. 3.

FIG. 9 shows an example of a configuration of the control circuit 14. It is to be noted that, in the control circuit 14 shown in FIG. 9, the margins MGN1 and MGN2 are set to an equal value MGN which is a positive value.

Referring to FIG. 9, the control circuit 14 shown includes an adder 141, a subtracter 142, another adder 143, a pair of comparators 144 and 145, a selector 146, a limiter 147, a storage element 148 and a decoder 149.

The storage element 148 stores data representative of the current frequency fc and signals the data to the adder 141, subtracter 142, selector 146 and comparator 145.

The adder 141 calculates a sum value "fc+$\Delta f$" of the current frequency fc and the frequency step $\Delta f$ and outputs it to the selector 146. Meanwhile, the subtracter 142 subtracts the frequency step $\Delta f$ from the current frequency fc to determine a difference "fc−$\Delta f$" and outputs the difference "fc−$\Delta f$" to the selector 146 and the comparator 144.

The adder 143 adds the activity ACT outputted from the counter 13 and the margin MGN and signals a resulting value "ACT+MGN" to the comparators 144 and 145.

The comparator 144 compares the difference "fc−$\Delta f$" outputted from the subtracter 142 and the sum "ACT+MGN" outputted from the adder 143 with each other to determine a relationship in magnitude between them and signals a result of the comparison to the selector 146.

Meanwhile, the comparator 145 compares the current frequency fc and the sum "ACT+MGN" outputted from the adder 143 with each other to determine a relationship in magnitude between them and signals a result of the comparison to the selector 146.

The selector 146 thus receives the data of the current frequency fc, the sum "fc+$\Delta f$" and the difference "fc−$\Delta f$" supplied thereto and selects a frequency based on the results of comparison by the comparators 144 and 145. The selector 146 thus signals the selected frequency to the limiter 147.

The limiter 147 refers to the frequency value or values from the register or registers (17 or/and 18), that is, the upper or/and lower limit values or the particular frequency value to limit the frequency value from the selector 146, and sends a result of the frequency limitation to the storage element 148. The data of the new frequency is thus stored into the storage element 148. Consequently, the value of the current frequency fc is updated. This updating is performed after every measurement time period T in accordance with an instruction from the timer 12.

The data of the current frequency fc stored in the storage element 148 is sent to the decoder 149. The decoder 149 thus produces and outputs an instruction signal (S142) for causing the clock supply circuit 15 to select a clock based on the data received from the storage element 148.

Accordingly, the comparison discrimination at step ST2 of FIG. 8 is performed by the comparator 145 while the comparison discrimination at step ST4 is performed by the comparator 144, and the processes at steps ST3, ST5 and ST6 are performed by the selector 146. Further, the processes at steps ST7 and ST8 are performed by the limiter 147 based on the register values.

As described hereinabove, the CPU 11 repeats a standby state and an operating state to process a task in synchronism with the system clock SYSCLK and sends the activity flag ACFLG to the counter 13 to measure the activity representative of the operation state of the CPU 11 within the measurement time period T. Then, a frequency of the system clock SYSCLK to be set subsequently is determined based on the measured activity. Thereupon, however, the clock frequency is limited with an upper limit threshold value or a lower limit threshold value designated by a register or limited so as to have a particular frequency value. A system clock SYSCLK having a frequency checked in this manner is generated by the clock supply circuit 15 and sent to the CPU 11 and so forth. Accordingly, when the clock frequency undergoes no frequency limitation, it is automatically changed in accordance with the activity of the system, that is, the ratio of the operating state of the system, but when the clock frequency undergoes frequency limitation, any frequency outside the allowable range is limited to the upper limit value or the lower limit value or else is invalidated and changed to a particular frequency.

It is to be noted that, while, in the foregoing description, only the CPU 11 is taken as an object of control, a plurality of objects may be used to control the clock frequency. For example, frequency control of the system clock SYSCLK may be performed based on a result of measurement of operation conditions of the CPU 11 and a plurality of peripheral circuits. In an actual circuit system, the CPU 11 and some other peripheral circuit or circuits may be operating simultaneously, the peripheral circuits may be in a standby state while the CPU 11 is operating, or conversely the peripheral circuits may be opening while the CPU 11 is in a standby state.

Therefore, if signals representative of operation conditions of the CPU and the peripheral circuits are used to determine a logical OR signal and the thus determined signal is supplied as an enable signal to the counter 13, frequency control of the system clock SYSCLK can be performed based on a result of synthetic measurement of the operation conditions of the plural control objects. In other words, if activity flags ACFLG individually representing operation conditions of the control objects are used to determine a logical OR signal of the flags and the determined logical OR signal is sent to the counter 13, the flag indicated by the logical OR signal can be regarded as the activity flag ACFLG indicative of the operation state of the entire system. Since this makes it possible to adopt the same control method without depending upon the number or the types of the control objects, a high degree of flexibility can be achieved. Further, since the operation condition of each of the control objects can be managed with the value of the activity flag ACFLG of 1 bit, considerable circuit modification or the like is not required.

Subsequently, management of the clock frequency where a plurality of applications are operating is described. According to conventional frequency management, for example, only simple designation of a frequency corresponding to an application is possible, and it is difficult to obtain a sufficient performance where a plurality of applications operate on an apparatus which incorporates an OS having a multi-task function. Further, it is difficult to perform detailed management of a frequency because the management is so rough that setting of a frequency or the like is performed using the timing of activation or ending of an application as a trigger.

Therefore, in the following description, an architecture is described which includes an element (frequency management section) which receives, from programs which are in an operating state, request information relating to a clock frequency suitable for an operation or a process of any of the programs and manages such information in a unified fashion. It is to be noted that the frequency management section (hereinafter referred to as frequency manager) is formed, for example, as software such as, for example, part of an OS or a device driver and can control, as setting parameters, the frequency of the system clock, an upper limit frequency and/or a lower limit frequency for the clock frequency which are controlled automatically by hardware, and so forth.

Figure 10:
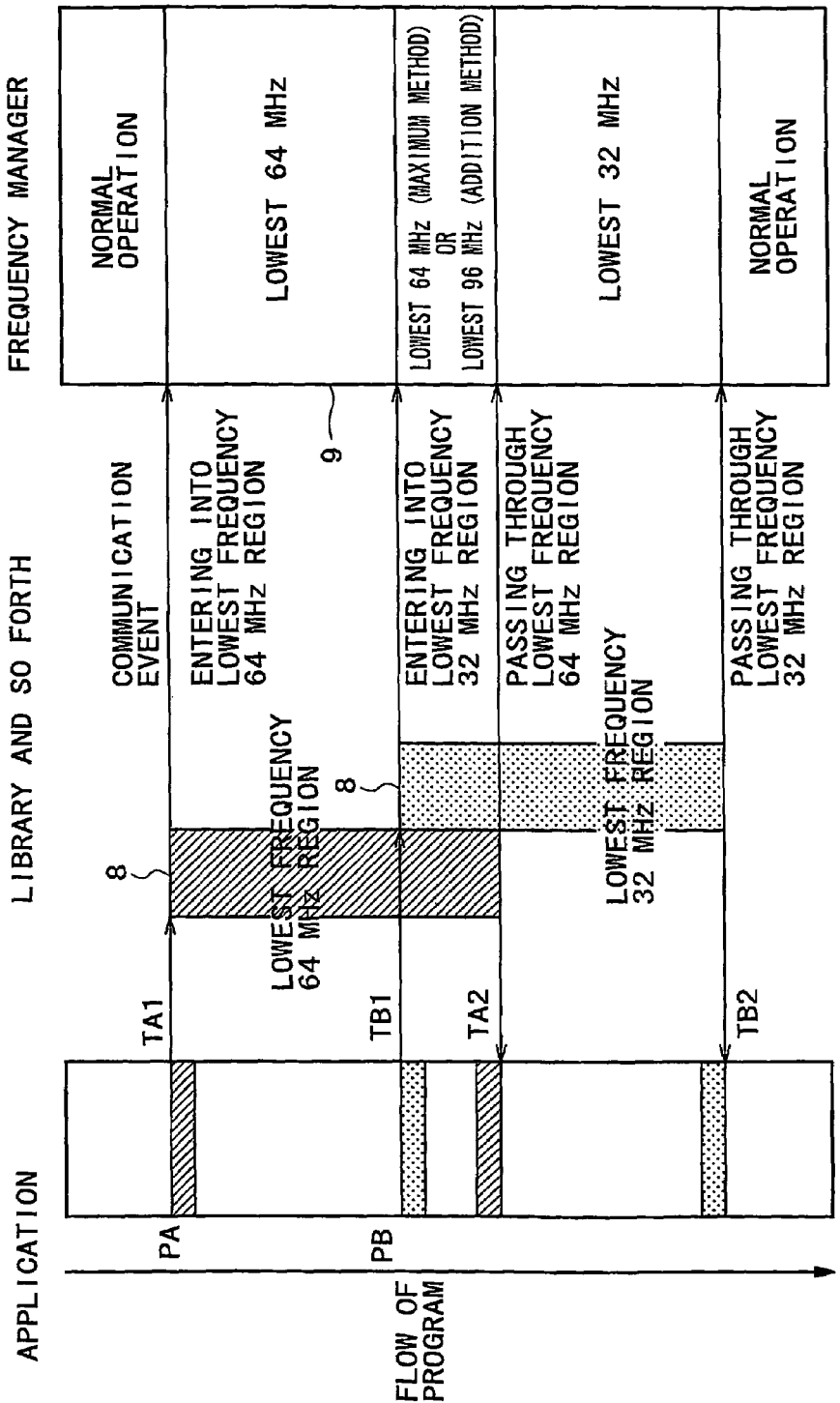
FIG. 10 is a diagrammatic view illustrating an example of control by a frequency manager of the information processing apparatus of FIG. 3.

FIG. 10 illustrates an example of a control algorithm.

Referring to FIG. 10, in the example illustrated, two application programs PA and PB operate such that they have a period (hereinafter referred to as overlapping period) within which they operate in an overlapping relationship with each other in time. A frequency request for the system clock is issued from each of the application programs PA and PB to the frequency manager 9 through a library (or device driver or the like) 8 called from the program. At time TA1 in FIG. 10, a library or the like is called from the application program PA, and at time TA2, the called process comes to an end. Further, at time TB1, a library or the like is called from the application program PB, and at time TB2, the called process is comes to an end. It is to be noted that the time TA1 or TB1 may be a point of time at which the respective program is activated or another point of time at which a particular process becomes required.

When a library or a device driver is called in a particular process such as a moving picture process or a speech process from any of the application programs PA and PB which operate on the present system, the library or device driver supplies frequency information necessary for the process to the frequency manager 9 so that optimum setting may be performed by the frequency manager 9. Since the library or device driver grasps contents of operation of itself in advance, it can retain information of an optimum setting parameter for the operation in the form of a numerical value or a lookup table.

System clock information or the like may be set in the following manner:

To set the lowest frequency for an application which involves the lowest necessary frequency (for example, in order to perform serial communication, to set the frequency to 16 MHz (Megahertz) or more;

To temporarily raise the lower limit value for the frequency in order to raise the performance (for example, where a secondary storage apparatus for which a semiconductor memory or the like is adopted is used, to set the frequency 96 MHz or more);

To control the frequency so as not to become lower than the lower limit value in order to prevent deterioration of the performance or the data quality and so forth (for example, to control the frequency to 32 MHz or more upon mixing of PCM sound data or to control the frequency to 64 MHz or more upon recording of moving pictures);

To set the highest frequency in an application which does not require a performance higher than a fixed level (for example, to control the frequency 64 MHz or lower upon reproduction of sound data or the like); and To set a fixed frequency value or an initial value for the frequency suitable for an application.

In addition, a lower limit value or an upper limit value to a frequency can be set in accordance with the type, transfer rate, format or the like of data of an object of processing. Where a lower limit value to an operation frequency of a CPU, a DSP (Digital Signal Processor) or the like is determined in accordance with a bit rate when a file including moving picture data or sound data is to be opened or in a like case, preferably the frequency lower limit value (123 MHz) is determined in accordance with the bit rate (786 kbps), for example, of the MPEG (Moving Picture Experts Group) 4. In short, the lower limit value is set to a higher value as the bit rate increases.

From the point of view of the entire system, in a situation wherein a plurality of applications are processed simultaneously and therefore a background process moves behind a foreground process, it is not known to the applications, a library, a device driver or the like what other programs are being executed currently. Therefore, optimum setting cannot be achieved if individual frequency setting is performed directly. Accordingly, an element which performs unified management of frequencies is required, and the frequency manager 9 has a role of determining a frequency range or a frequency value by changing the threshold value settings based on frequency setting information.

In the frequency manager 9 illustrated in FIG. 10, the application program PA whose lowest frequency is 64 MHz and the application program PB whose lowest frequency is 32 MHz are illustrated in a situation wherein they move in an overlapping relationship within a period of time from time TB1 to time TA2. Each of the libraries (or device drivers) 8 called from the individual programs conveys, at an entrance and an exit thereof, optimum frequency setting information to the frequency manager 9. The frequency manager 9 thus performs optimum setting based on the received information.

For example, the lowest frequency within the period from time TA1 to time TB1 is set to 64 MHz, and the lowest frequency within the period from time TA2 to time TB2 is set to 32 MHz. It is to be noted that the term "normal operation" signifies a state wherein minimum elements necessary to the system such as the frequency manager 9 or the OS are operating, that is, a state wherein the lowest frequency is set while no application is operating.

For example, the following two forms are available for an algorithm for allowing the frequency manager 9 to set an appropriate frequency within an overlapping period within which a plurality of programs are operating:

(I) A form wherein information having a maximum value among the given lowest frequencies (lower limit values), highest frequencies (upper limit values) or particular frequencies is adopted and set (maximum method); and (II) Another form wherein information obtained by adding the given lowest frequencies (lower limit values), highest frequencies (upper limit values) or particular frequencies is adopted and set (adding or totaling method).

First, according to the maximum method (1), when the frequency manager 9 receives a notification of information including lower limit frequency values or upper limit frequency values required for the clock frequency, it adopts a maximum frequency value from within the received information. For example, where the lower or upper limit frequencies required from operating applications through libraries or the like are represented by fi (i=1, 2, . . . ) and a maximum value function is represented by MAX( ), the frequency manager 9 calculates he preset value fs in accordance with fs=MAX(f1, f2, . . . ).

Where the maximum method (I) is applied to an example of FIG. 10, the regions of 64 MHz and 32 MHz overlap with each other within an overlapping period from time TB1 to time TA2, and for the overlapping period, MAX(64, 32)=64 MHz is set.

On the other hand, according to the adding or totaling method (II), when the frequency manager 9 receives a notification of information including lower limit values or upper limit values required for the clock frequency, it adopts a frequency value obtained by adding the frequency values of the received information. For example, the frequency manager 9 uses the frequencies fi (i=1, 2, . . .) mentioned hereinabove to calculate a preset value fs in accordance with fs=Σfi (Σ represents the sum total with regard to the natural number variable i). Or, another form may be used wherein the addition is further generalized such that values obtained by multiplying the frequencies fi by weighting coefficients ki (preset value fs=Σ(ki·fi)) are added.

Where the adding or totaling method (II) is applied to the example of FIG. 10, 64+32=96 MHz is set within an overlapping period from time TB1 to time TA2.

It is to be noted that also a form which uses both of the maximum method (I) and the adding or totaling method (II) depending upon a situation or conditions is possible, and a frequency range (upper and lower limit values) or a frequency value for the clock signal can be determined in accordance with various calculation methods. Further, when a certain program comes to an end in the system, a notification of the end of the program is sent to the frequency manager 9, and the frequency manager 9 performs a process for restoration of the optimum setting by updating the frequency setting as occasion demands. For example, in the maximum method (I), when a certain program comes to an end, a maximum value is adopted from within frequency information of the remaining programs. Meanwhile, in the adding or totaling method (II), when a certain program comes to an end, a value obtained by subtracting the frequency information of the program from the sum total of frequency information till then is adopted. In either case, a frequency range or a frequency value is set based on information including lower limit frequency values or upper limit frequency values required for the clock frequency from the other operating programs. It is to be noted that the adding or totaling method (II) is preferably used when requests for resource acquisition from a plurality of programs are competent, but where there is no possibility of such competition, the maximum method (I) can be used.

The conventional frequency management does not take it inconsideration that a plurality of applications operate and, for example, when a certain application program is executed, setting unique to the application is performed to the utmost. Therefore, such fine setting cannot be achieved by the conventional frequency management. In contrast, according to the frequency management described above, a request for frequency setting can be issued to the frequency manager 9 any time when a high processing performance is required for a library, a device driver or the like. Therefore, the frequency management described above can cope also with such a situation that a high performance is required at part of a process (task) of an application. Further, even where an application which requires a plurality of performances is operating, since unified frequency management can be performed by the frequency manager 9, it is possible to achieve optimum setting for the entire system, which is difficult from an individual point of view from the application side. In other words, a frequency can be set while the overall situation of the entire system is grasped sufficiently.

As described above, in a system wherein, in control of a system clock or the like, for example, upper and lower limits to the clock frequency can be controlled by software, preferably a library, a device driver or a like element called from an application when the application is executed transmits system clock information suitable for its operation to a frequency manager so that the frequency manager controls the frequency of the overall system.

It is to be noted that while the foregoing description is directed to the form wherein an application communicates with the frequency manager 9 through a library or a device driver, the form of communication is not limited to this, and various forms are possible including a form wherein an application itself communicates with the frequency manager 9.

Further, the form wherein frequency request information is transmitted to a frequency manager is not limited to the form wherein an application, a library or a like element called from an application is used as a processing unit to perform the transmission. For example, where a process (which is an allocation unit of a computer resource and includes an execution program, a thread or the like) or a thread (which is a minimum unit of allocation of a processor and is formed from a program counter, various register sets, a stack area, a private store area and so forth) is used as a unit, finer control can be anticipated.

In order to reduce power consumption, a technique of varying the clock frequency for a CPU, a DSP, a memory, a bus or the like as occasion demands is used. However, in a system wherein processes or threads which operate in a multi-thread environment, that is, in a system environment which allows one process to have a plurality of threads, are not specified, it is a problem how to determine a clock frequency necessary for a CPU and so forth.

In a single thread system, the clock for a CPU, a DSP, a bus or the like necessitated by the thread is known in advance, and therefore, the clock frequency may be set to a value which satisfies operation of them. However, in a multi-thread system, individual clock frequencies cannot be specified in advance. Therefore, a method is adopted wherein an operation situation of a CPU or the like is measured to variably and dynamically control the clock frequency. However, where a delay in response time matters, for example, the clock frequency rises after shortage of the performance from a necessary level is found through a measurement. Therefore, since the clock frequency is lowered after it is found after measurement that there is the possibility that shortage in performance may temporarily occur when a thread or a process having a high load is activated or that the CPU or the like has a superfluous performance when a thread or a process comes to an end, wasteful power is consumed in the meantime.

Therefore, where the form (II) described hereinabove is adopted, the following control is adopted:

To register a clock frequency required by a process or a thread in advance;

To cause the frequency manager to calculate a sum total value of frequencies relating to all of processes or threads being currently active in regard to programs operating in the system to perform setting management of clock frequencies; and To cause, when an activated process or thread comes to an end, the frequency manager to subtract the frequency regarding the process or thread from the sum total value of frequencies to update the clock frequency.

In other words, frequencies required by individual processes or threads are registered into a database, a reference table, a header or the like in advance. Then, in order to calculate a frequency which satisfies the frequencies required for all of processes or threads being currently active, the frequency necessary before a process or thread is activated is added, and immediately after a process or thread comes to an end, the frequency regarding the process or thread is subtracted from the sum total value, thereby to set a normally optimum frequency. Then, a clock of the set frequency is supplied to the CPU, DSP, memory, bus and so forth. It is to be noted that the applied system may have any of the following architectures:

An architecture wherein a dynamically variably settable clock is independent among individual functions of the system such as a CPU;

Another architecture wherein a clock frequency can be set only for some of functions; and A further architecture wherein a clock frequency can be set collectively for all functions or a plurality of functions.

In the following, for simplified description, an example of an architecture wherein a single clock frequency can be varied dynamically is described with reference to FIG. 11.

A minimum clock frequency necessary to assure a clock frequency necessitated by an OS or a function of a system is represented by A0. It is to be noted here that, for the clock frequency A0, a higher one of a frequency value necessary for the OS and a frequency value necessary for system assurance is adopted.

It is assumed that the clock frequencies necessitated by all threads are found through a measurement in advance. In particular, the clock frequency necessitated by a thread 1 is A1 measured in advance, and the clock frequency necessitated by a thread 2 is A2. Similarly, the clock frequencies necessitated by threads 3, 4, 5, . . . are A3, A4, A5, . . . , respectively. It is to be noted that, while description is given with regard to a thread or threads, the thread or threads may be replaced suitably by a process or processes in the foregoing description and in the following description.

The clock frequency when only the OS is operating is A0, and if it is tried to activate the thread 1, the value "A0+A1" obtained by adding the clock frequency A1 necessitated by the thread 1 to the clock frequency A0 is set. Thus, a clock of the frequency "A0+A1" is supplied to the CPU and so forth, and thereafter, the thread 1 is activated. If it is intended to further activate the thread 2, it is activated after the clock frequency is raised to "A0+A1+A2" which is the sum of the current frequency "A0+A1" and the clock frequency A2 necessitated by the thread 2. In this manner, when it is intended to activate a thread, it is activated after the clock is controlled so that it has a frequency equal to the sum of the current frequency and the frequency necessitated by the thread. Since a thread is activated after the clock frequency is raised to a necessary level in advance, shortage in performance is not caused by a thread activated newly. It is to be noted that, since the frequency to be actually set need not necessarily be changed arbitrarily as a continuous amount, for example, the clock frequency of "A0+A1+A2" may not possibly be set accurately as it is depending upon the hardware configuration. In such an instance, the clock frequency should be set to a value which is not lower than "A0+A1+A2". For example, the nearest value to the frequency "A0+A1+A2" may be selected among a plurality of choices which are higher than the "A0+A1+A2", or a plurality of clocks having different frequencies are combined in time to obtain an approximate value to be used.

On the contrary, when it is intended to end the thread 2 while the threads 1 to 3 are activated (the clock frequency in this instance is "A0+A1+A2+A3"), the clock frequency is lowered to "A0+A1+A3" obtained by subtracting the clock frequency A2 necessitated by the thread 2 from the clock frequency "A0+A1+A2+A3" after the thread 2 is ended. If the thread A1 is ended further, the clock frequency is further lowered to "A0+A3". Since the clock frequency is lowered after a thread is ended in this manner, shortage in performance is prevented, and since the clock frequency is lowered by an amount necessitated by the thread immediately after the thread comes to an end, the power consumption can be reduced immediately.

It is to be noted that the method described above can be applied similarly also to a case wherein a plurality of sources (clock signal generation elements) whose clock frequency is variable. In this instance, a necessary frequency (B0, B1, B2, . . . , C0, C1, C2, . . . , or the like) or a different clock may individually be added or subtracted in response to activation or ending of a thread or a process.

According to the configuration described above, typically the following advantages can be anticipated:

It is possible to augment a performance or lower the power consumption by controlling the frequency or the power supply voltage using information which cannot be grasped only by software;

It becomes possible to designate an optimum frequency or an optimum range of frequency by means of an application and prevent performance deterioration by an inadvertent frequency drop or increase of the power consumption by inadvertent increase of the frequency;

Even in a situation wherein a plurality of applications are active and another job is being processed on the background, it is possible to perform optimum frequency setting by means of a frequency manager which appropriately grasps and manages the situation.

Since the clock frequency can be raised to a necessary level before a thread or a process is activated, shortage in performance does not occur immediately after the thread or process is activated. Further, when a thread or a process is to be ended, since the clock frequency can be lowered immediately after the thread or process comes to an end, the power consumption can be reduced immediately. In other words, since clock frequencies necessitated by individual threads or processes are measured in advance, a necessary clock frequency can be supplied appropriately, and therefore, fine power control can be achieved.

INDUSTRIAL APPLICABILITY

The present invention can be applied not only to a frequency control apparatus, an information processing apparatus and a program for use with the apparatus but widely to information recording media on which a program having the operation frequency limitation function described above is recorded (that is, various recording media and storage media which can be loaded into an information processing apparatus to install the program into a memory), operation frequency limitation methods for an object of control and so forth.

The invention claimed is:

1. A frequency control apparatus which observes an operation state of a control object and controls an operation frequency of the control object, comprising:

frequency determination means for determining the operation frequency in response to the operation state of the control object; and frequency limitation means for limiting a range or a value of the operation frequency determined by said frequency determination means, said frequency limitation means changing the operation frequency based on an activity of the control object, said activity being a ratio of a period of time within which the control object is operating within a predetermined measurement time period.

2. A frequency control apparatus according to claim 1, further comprising:

means for discriminating whether or not a frequency of a clock signal supplied to the control object to define the operation frequency of the control object is within a prescribed or designated frequency range or has a prescribed or designated frequency value, said frequency limitation means limiting the frequency of the clock signal to a frequency within the frequency range or to the frequency value when it is discriminated that the frequency of the clock signal is not within the frequency range or does not have the frequency value.

3. A frequency control apparatus according to claim 2, wherein said frequency limitation means includes threshold value setting means for setting a threshold value of an upper limit or a lower limit to the frequency of the clock signal.

4. A frequency control apparatus according to claim 3, wherein said threshold value setting means includes a frequency setting register having the threshold value which can be changed dynamically through execution of a program.

5. A frequency control apparatus according to claim 3, wherein said threshold value setting means sets threshold values of an upper limit and a lower limit to the frequency of the clock signal simultaneously to limit a frequency width of the clock signal.

6. A frequency control apparatus according to claim 5, wherein said threshold value setting means sets the threshold values of the upper limit and the lower limit to an equal value so that the frequency of the clock signal is limited to the fixed value.

7. A frequency control apparatus according to claim 2, wherein said frequency limitation means includes frequency designation means for designating the frequency of the clock signal.

8. A frequency control apparatus according to claim 1, wherein said frequency determination means observes the operation state of the control object after every fixed interval of time and determines the operation frequency based on the observed operation state.

9. A frequency control apparatus according to claim 1, wherein the control object is a device for an arithmetic operation process which operates with a frequency selectively set among a plurality of clock frequencies.

10. A frequency control apparatus comprising:

frequency determination means for determining the operation frequency in response to the operation state of the control object;

frequency limitation means for limiting a range or a value of the operation frequency determined by said frequency determination means, said frequency limitation means limiting the frequency of the clock signal to a frequency within the frequency range or to the frequency value when it is discriminated that the frequency of the clock signal is not within the frequency range or does not have the frequency value, said frequency limitation means includes threshold value setting means for setting a threshold value of an upper limit or a lower limit to the frequency of the clock signal;

means for discriminating whether or not a frequency of a clock signal supplied to the control object to define the operation frequency of the control object is within a prescribed or designated frequency range or has a prescribed or designated frequency value; and frequency management means for receiving, from each of operating programs, a notification of required information regarding the frequency of the clock signal suitable for the operation of the program and managing the information from the programs in a unified manner, said threshold value setting means setting the frequency range or the frequency value for the clock signal in accordance with a setting instruction of said frequency management means.

11. A frequency control apparatus according to claim 10, wherein, when said frequency management means receives, from each of the operating programs, a notification of required information including a lower limit frequency value or an upper limit frequency value regarding the frequency of the clock signal, said frequency management means adopts the highest frequency value in the information of the received notifications to determine the frequency range or the frequency value for the clock signal.

12. A frequency control apparatus according to claim 10, wherein, when said frequency management means receives, from each of the operating programs, a notification of required information including a lower limit frequency value or an upper limit frequency value regarding the frequency of the clock signal, said frequency management means adds the frequency values in the information of the received notifications and adopts a frequency value equal to the sum value to determine the frequency range or the frequency value for the clock signal.

13. A frequency control apparatus according to claim 10, wherein, when said frequency management means receives a notification of an end of one of the programs when the program comes to an end, said frequency management means determines the frequency range or the frequency value for the clock signal based on required information including a lower limit frequency value or an upper limit frequency value regarding the frequency of the clock signal from each of the other operating programs.

14. A frequency control apparatus according to claim 10, wherein frequencies of the clock signal required by processes or threads regarding the programs are registered in advance in said frequency management means, and said frequency management means calculates an added total value of the frequencies of all of the processes or threads of the operating programs and performs frequency setting based on the added total value before a process or a thread of any of the operating programs is activated, and when the activated process or thread comes to an end, said frequency management means immediately subtracts the frequency of the process or thread from the added total value.

15. An information processing apparatus for controlling a frequency of a clock signal to be supplied to an object device which operates with a frequency variably set at any time, comprising:

means for observing an operation state of the object device;

frequency determination means for determining the frequency in response to the operation state of the object device; and frequency limitation means for limiting a range or a value of the frequency determined by said frequency determination means, said frequency limitation means changing the operation frequency based on an activity of the control object, said activity being a ratio of a period of time within which the control object is operating within a predetermined measurement time period.

16. An information processing apparatus according to claim 15, further comprising:

means for discriminating whether or not a frequency of a clock signal supplied to the object device is within a prescribed or designated frequency range or has a prescribed or designated frequency value, said frequency limitation means limiting the frequency of the clock signal to a frequency within the frequency range or to the frequency value when it is discriminated that the frequency of the clock signal is not within the frequency range or does not have the frequency value.

17. An information processing apparatus according to claim 16, wherein said frequency limitation means includes threshold value setting means for setting a threshold value of an upper limit or a lower limit to the frequency of the clock signal.

18. An information processing apparatus according to claim 17, wherein said threshold value setting means includes a frequency setting register having the threshold value which can be changed dynamically through execution of a program.

19. An information processing apparatus according to claim 18, wherein said threshold value setting means sets threshold values of an upper limit and a lower limit to the frequency of the clock signal simultaneously to limit a frequency width of the clock signal.

20. An information processing apparatus according to claim 19, wherein said threshold value setting means sets the threshold values of the upper limit and the lower limit to an equal value so that the frequency of the clock signal is limited to the fixed value.

21. An information processing apparatus according to claim 16, wherein said frequency limitation means includes frequency designation means for designating the frequency of the clock signal.

22. An information processing apparatus according to claim 15, wherein said frequency determination means observes the operation state of the object device after every fixed interval of time and determines the frequency based on the observed operation state.

23. An information processing apparatus according to claim 15, wherein the object device is a device for an arithmetic operation process.

24. An information processing apparatus comprising:

means for observing an operation state of the object device;

frequency determination means for determining the frequency in response to the operation state of the object device;

frequency limitation means for limiting a range or a value of the frequency determined by said frequency determination means, said frequency limitation means limiting the frequency of the clock signal to a frequency within the frequency range or to the frequency value when it is discriminated that the frequency of the clock signal is not within the frequency range or does not have the frequency value, said frequency limitation means includes threshold value setting means for setting a threshold value of an upper limit or a lower limit to the frequency of the clock signal, said threshold value setting means includes a frequency setting register having the threshold value which can be changed dynamically through execution of a program;

means for discriminating whether or not a frequency of a clock signal supplied to the object device is within a prescribed or designated frequency range or has a prescribed or designated frequency value; and frequency management means for receiving, from each of operating programs, a notification of required information regarding the frequency of the clock signal suitable for the operation of the program and managing the information from the programs in a unified manner, said threshold value setting means setting the frequency range or the frequency value for the clock signal in accordance with a setting instruction of said frequency management means.

25. An information processing apparatus according to claim 24, wherein, when said frequency management means receives, from each of the operating programs, a notification of required information including a lower limit frequency value or an upper limit frequency value regarding the frequency of the clock signal said frequency management means adopts the highest frequency value in the information of the received notifications to determine the frequency range or the frequency value for the clock signal.

26. An information processing apparatus according to claim 24, wherein, when said frequency management means receives, from each of the operating programs, a notification of required information including a lower limit frequency value or an upper limit frequency value regarding the frequency of the clock signal, said frequency management means adds the frequency values in the information of the received notifications and adopts a frequency value equal to the sum value to determine the frequency range or the frequency value for the clock signal.

27. An information processing apparatus according to claim 24, wherein, when said frequency management means receives a notification of an end of one of the programs when the program comes to an end, said frequency management means determines the frequency range or the frequency value for the clock signal based on required information including a lower limit frequency value or an upper limit frequency value regarding the frequency of the clock signal from each of the other operating programs.

28. An information processing apparatus according to claim 26, wherein frequencies of the clock signal required by processes or threads regarding the programs are registered in advance in said frequency management means, and said frequency management means calculates an added total value of the frequencies of all of the processes or threads of the operating programs and performs frequency setting based on the added total value before a process or a thread of any of the operating programs is activated, and when the activated process or thread comes to an end, said frequency management means immediately subtracts the frequency of the process or thread from the added total value.

29. A computer readable medium including computer executable instructions, wherein the instructions, when executed by a processor, cause the processor to perform a method comprising:

setting, upon or after activation of the program, a limitation value for limiting the operation frequency in accordance with a characteristic of a load or an accuracy in processing;

calculating an activity as a ratio of a period of time within which the control object is operating within a predetermined measurement time period; and changing the operation frequency based on the activity of the control object.

30. A computer readable medium according to claim 29, wherein the program further comprises:

canceling the setting relating to or resetting the limitation to the operation frequency performed upon or after the activation.

* * * * *